(12) United States Patent
Yoshida et al.

(10) Patent No.: US 6,819,167 B2
(45) Date of Patent: Nov. 16, 2004

(54) FILTER CIRCUIT

(75) Inventors: Yoshikazu Yoshida, Hyogo (JP); Akira Yoshida, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 13 days.

(21) Appl. No.: 10/340,595

(22) Filed: Jan. 13, 2003

(65) Prior Publication Data

US 2003/0132798 A1 Jul. 17, 2003

Related U.S. Application Data

(60) Provisional application No. 60/348,375, filed on Jan. 16, 2002.

(51) Int. Cl.[7] ................................................ H03K 5/00
(52) U.S. Cl. ...................................... 327/552; 327/103
(58) Field of Search ................................. 327/552, 553, 327/554, 555, 556, 557, 558, 559, 103; 330/109, 107, 305

(56) References Cited

U.S. PATENT DOCUMENTS 5,245,565 A * 9/1993 Petersen et al. ............. 708/819
6,441,682 B1 * 8/2002 Vinn et al. ................... 327/552
6,525,621 B2 * 2/2003 van Zeijl et al. ......... 333/28 R \* cited by examiner

*Primary Examiner*—Dinh T. Le
(74) *Attorney, Agent, or Firm*—Volentine Francos & Whitt, PLLC

(57) ABSTRACT

A filter circuit having an input resistance portion including a first transconductor having a positive input port impressed with a first voltage, a negative input port impressed with a second voltage, a positive output port and a negative output port; a second transconductor having a positive input port impressed with the second voltage, a negative input port impressed with a third voltage, a positive output port and a negative output port; and a third transconductor having a positive input port coupled to the positive output ports of the first and second transconductors and the negative output port of the third transconductor, a negative input port coupled to the negative output ports of the first and second transconductors and the positive output port of the third transconductor, a positive output port and a negative output port.

14 Claims, 7 Drawing Sheets

R-R

R-oo

O-R

FILTER CIRCUIT

This claims priority under 35 USC §119(e) (1) of Provisional Application No. 60/348,375, filed on Jan. 16, 2002.

BACKGROUND OF THE INVENTION

1. Field of the Invention

The present invention relates, in general, to a filter circuit and, more particularly, to a filter circuit having a transconductance amplifier.

2. Description of the Related Art

The conventional filter circuit is disclosed in "A circuit design method of an analog filter", page 146 lines 11–17 and FIG. 4.57, Toshio Horikawa, SOGODENSHISYUPANSYA, and Japanese Patent Application Laid Open Number 11-112286.

Horikawa discloses, as shown in FIGS. 6(A)–6(C), an LC ladder type filter circuit which has three types. One type, as shown in FIG. 6(A), is that a resistance is supplied between two input ports and between two output ports, respectively (R-R type). Another type, as shown in FIG. 6(B), is that a resistance is only supplied between two input ports (R-∞ type). The other type, as shown in FIG. 6(C), is that a resistance is only supplied between two output ports (0-R type).

FIG. 7 is a circuit diagram showing a differential input type Low Pass Filter (LPF) circuit which is R-R type. In FIG. 7, the LPF circuit has an input resistance portion 710, a filter portion 720 and an output end resistance portion 730. The input resistance portion 710 comprises two transconductance amplifiers 711 and 712.

However, the input dynamic range of the LPF circuit depends on the input dynamic range of the transconductance amplifier 711. The voltage amplitude of the differential input signal to be input to the LPF circuit, is a value that one transconductance amplifier shares.

FIG. 8 is wave diagram showing frequency characteristics of the differential input type LPF circuit. In FIG. 8, the vertical axis shows gain and the horizontal axis shows frequency. The cutoff frequency of the differential input type LPF circuit is shown as "fc". The left side of fc is a passing band and the right side of fc is a cutoff band. When a mixed signal having frequency f1 which is in the passing band and frequency f2 which is in the cutoff band is input to the differential input type LPF circuit, a voltage amplitude peak of the mixed signal is the sum of voltage amplitude of the frequency f1 and the frequency f2. When the input dynamic range of the transconductance amplif1er 711 is Vdr and when the voltage amplitude peak of the mixed signal to be input is over Vdr, the operation of the differential input type LPF circuit is not guaranteed.

SUMMARY OF THE INVENTION

According to one aspect of the present invention, there is provided a filter circuit of an input resistance portion, wherein said input resistance portion includes a first transconductance means having a positive input port, a negative input port, a positive output port and a negative output port, wherein the positive input port is impressed with a first voltage, and wherein the negative input port is impressed with a second voltage; a second transconductance means having a positive input port, a negative input port, a positive output port and a negative output port, wherein the positive input port is impressed with the second voltage, and wherein the negative input port is impressed with a third voltage; and a third transconductance means having a positive input port, a negative input port, a positive output port and a negative output port, wherein the positive input port is coupled to the positive output ports of the first and second transconductance means and the negative output port of the third transconductance means, and wherein the negative input port is coupled to the negative output ports of the first and second transconductance means and the positive output port of the third transconductance means.

DETAILED DESCRIPTION OF THE PREFERRED EMBODIMENTS

A filter circuit according to the preferred embodiments of the present invention will be described. Moreover, not all the combinations of the characteristics of the present invention described in the embodiments are essential to the present invention.

A filter circuit according to a first preferred embodiment of the present invention will be described with reference to FIGS. 1–3. The filter circuit according to the first preferred embodiment of the present invention is R-R type filter. The R-R type filter is used as high-powered communication filter.

First, the composition of the filter circuit according to the first preferred embodiment of the present invention will be described. FIG. 1 is a circuit block diagram showing a filter circuit according to the first preferred embodiment of the present invention. FIG. 2 is a block diagram showing a transconductance amplifier according to the first preferred embodiment of the present invention. FIG. 3 is a circuit block diagram showing the transconductance amplifier according to the first preferred embodiment of the present invention.

Figure 1:
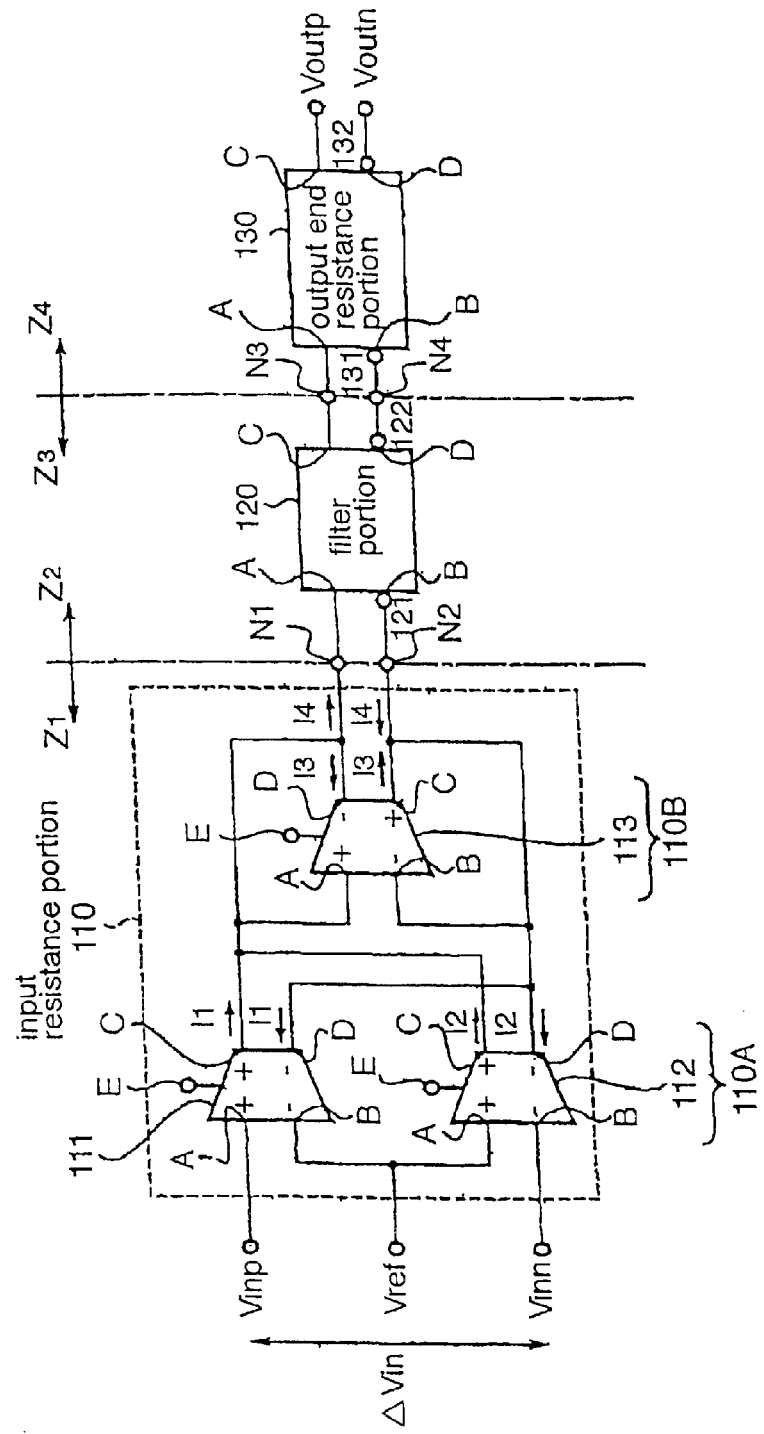
FIG. 1 is a circuit block diagram showing a filter circuit according to a first preferred embodiment of the present invention.

As shown in FIG. 1, the filter circuit has an input resistance portion 110, a filter portion 120 and an output end resistance portion 130. The input resistance portion 110 is coupled to input terminals Vinp, Vref and Vinn, and is coupled to the filter portion 120 through nodes N1 and N2. The filter portion 120 is coupled to the output end resistance portion 130 through nodes N3 and N4. The output end resistance portion 130 is coupled to output terminals Voutp and Voutn.

The input resistance portion 110 comprises an input portion 110A and an output portion 110B. The input portion 110A has two transconductance amplifiers 111 and 112. The output portion 110B has a transconductance amplifier 113.

Figure 2:
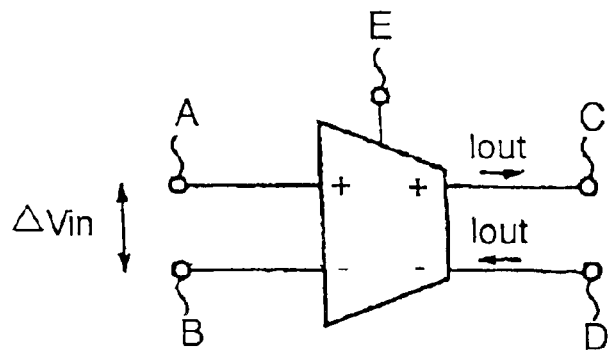
FIG. 2 is a block diagram showing a transconductance amplifier according to the first preferred embodiment of the present invention.
Figure 3:
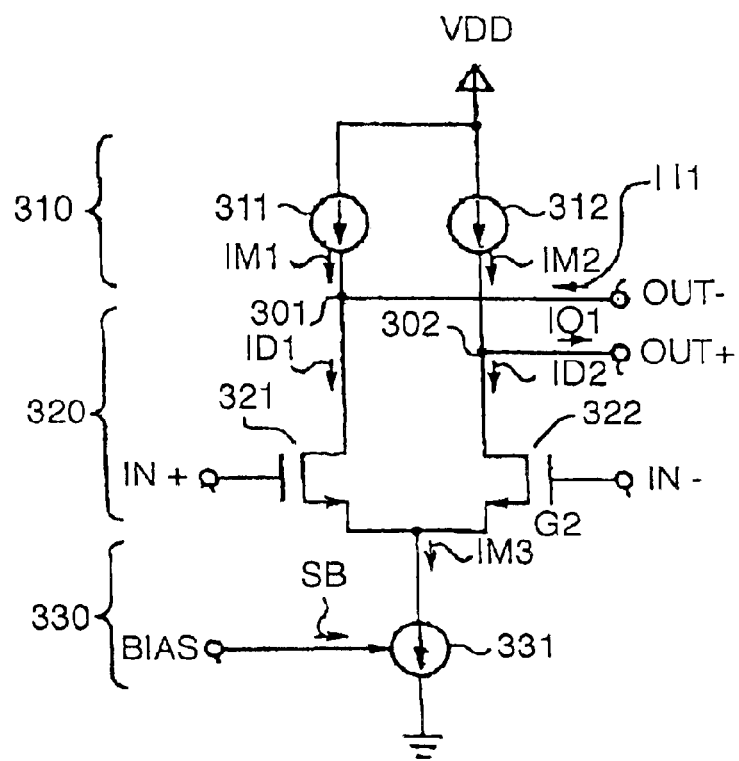
FIG. 3 is a circuit block diagram showing the transconductance amplifier according to the first preferred embodiment of the present invention.

In FIG. 2, the transconductance amplifier has a positive input port A, a negative input port B, a positive output port C, a negative output port D and an adjustment port E. The transconductance amplifier generates output current at the output ports C and D which is proportional to amplitude of input voltage being applied between two input ports A and B. When potential difference ΔVin between two input ports A and B is generated, the transconductance amplifier outputs current Iout from the positive output port C and inputs current Iout from the negative output port D. The next equation shows mutual conductance GM of the transconductance amplifier.

$$GM = Iout/\Delta Vin$$

In FIG. 1, the input terminal Vinp is coupled to a positive input port A of the transconductance amplifier 111. The input terminal Vref is coupled to a negative input port B of the transconductance amplifier 111 and a positive input port A of the transconductance amplifier 112. The input port Vinn is coupled to a negative input port B of the transconductance amplifier 112. A positive output port C of the transconductance amplifier 111 is coupled to a positive output port C of the transconductance amplifier 112 and a positive input port A and a negative output port D of the transconductance amplifier 113. A negative output port D of the transconductance amplifier 111 is coupled to a negative output port D of the transconductance amplifier 112 and a negative input port B and a positive output port C of the transconductance amplifier 113. The negative output port D of the transconductance amplifier 113 is coupled to node N1 and the positive output port C thereof is coupled to node N2. A terminal A of the filter port 120 is coupled to node N1, and a terminal B thereof is coupled to node N2 through a reverse terminal 121. A terminal C of the filter port 120 is coupled to node N3, and a terminal D thereof is coupled to node N4 through a reverse terminal 122. A terminal A of the output end resistance port 130 is coupled to node N3, and a terminal B thereof is coupled to node N4 through a reverse terminal 131. A terminal C of the output end resistance port 130 is coupled to the 1output terminal Voutp, and a terminal D thereof is coupled to the output terminal Voutn through a reverse terminal 132.

Next, the composition of the transconductance amplifier according to the first preferred embodiment of the present invention will be described with reference to FIG. 3. Mutual conductance GM of all transconductance amplifiers 111–113 are the same each other. In FIG. 3, the transconductance amplifier comprises a current source portion 310, a differential amplifier portion 320 and a control portion 330.

The current source portion 310 has two current sources 311 and 312. The current source 311 outputs current IM1, and the current source 312 outputs current IM2. When each current source comprises a PNP transistor, each transistor characteristics and each base-emitter voltage Vbe of the PNP transistors are the same as each other. In this case, current IM1 and IM2 correspond to collector current of the PNP transistors, respectively. If possible, the current sources 311 and 312 may comprise one high-accuracy current mirror circuit which comprises a plurality of transistors and diodes, instead of the individual transistor. It is important that current value of current IM1 must be equal to current value of current IM2. The differential amplifier portion 320 has two N type MOS field effect transistors (NMOS transistors) 321 and 322 each of which has a gate electrode, a source electrode and a drain electrode. Each transistor characteristic of each NMOS transistor is substantively the same as each other. The control portion 330 has a variable current source 331. The variable current source 331 outputs current IM3 the current value of which is controlled by a control signal SB.

A first terminal of the current source 311 is supplied with supply voltage VDD, and the other terminal thereof is coupled to node 301. A first terminal of the current source 312 is supplied with supply voltage VDD, and the other terminal thereof is coupled to node 302. Node 301 is coupled to the negative output port, and node 302 is coupled to the positive output port. A gate electrode of NMOS transistor 321 is coupled to the positive input port, a drain electrode is coupled to node 301 and a source electrode is coupled to one terminal of the variable current source 331. A gate electrode of NMOS transistor 322 is coupled to the negative input port, a drain electrode is coupled to node 302 and a source electrode is coupled to the first terminal of the variable current source 331. The other terminal of the variable current source 331 is supplied with ground voltage GND. The variable current source 331 has input thereto control signal SB through the adjustment terminal.

As has been mentioned, each input port of each transconductance amplifier is coupled to each gate electrode of each NMOS transistor. Each input port is hardly input current, but is substantially only input voltage. Each value of each drain current (ID1, ID2) is changed based on input voltage. Each transconductance amplifier outputs or inputs current (I1, IO1) which is equal to current difference between constant current (IM1, IM2) and drain current (ID1, ID2). Each voltage which is output by each output port corresponds to drain-source voltage Vds of NMOS transistor (321, 322).

The operation of the filter circuit according to the first preferred embodiment of the present invention will be described.

The input terminals Vinp and Vinn have input thereto a differential input signal (in-phase input signal), respectively. Current IM3 keeps a certain current value based on the control signal SB which is input through the adjustment port E.

When the input terminals Vinp and Vinn have input thereto the in-phase input signal, each electric potential of each of the input terminals Vinp, Vref and Vinn is equal to each other. In this case, in the transconductance amplifier 111, electric potential of the positive input port is the same as that of the negative input port, and current value of current IM3 is a certain current value. Each current value of each of drain current (ID1, ID2) is a certain current value. Each drain-source voltage Vds is a certain voltage value. Therefore, current value of current I11 shown in FIG. 3 (current I1 is input through the negative output port D in FIG. 1) and current value of current IO1 shown in FIG. 3 (current I1 is output through the positive output port C in FIG. 1) are constant, respectively. Also, voltage levels of the positive and negative output ports are constant, respectively. As the transistor characteristics of NMOS transistors 321 and 322 are the same as each other, current value of current I11 is equal to that of current IO1. Therefore, current I1 at the positive and negative output ports of the transconductance amplifier 111 are input and output, otherwise are not. In addition, the transistor characteristic of NMOS transistor 321 is the same as that of NMOS transistor 322, so voltage level of the positive output port of the transconductance amplifier 111 is the same as that of the negative output port thereof.

Similarly, current I2 at the positive and negative output ports of the transconductance amplifier 112 are input and output, otherwise are not. Voltage level of the positive output port of the transconductance amplifier 112 is the same as that of the negative output port thereof. In addition, current I3 at the positive and negative output ports of the transconductance amplifier 113 are input and output, otherwise are not. Voltage level of the positive output port of the transconductance amplifier 113 is the same as that of the negative output port thereof.

At this time, the terminals A and B of the filter portion 120 are input and output to current which have the same current value, otherwise are not. Also, terminals A and B are impressed voltage which has the same voltage value. Therefore, the differential input signal is not supplied to the filter portion 120 from the input resistance portion 110.

In the next case, input terminals Vinp and Vinn have input thereto the differential input signal (reversed-phase input signal), respectively. Two states are caused alternately according to the states of the differential input signal. A first state is Vinp>Vref>Vinn, and a second state is Vinp<Vref<Vinn. Each input terminal has electric potential with respect to each other. The input terminal Vref has reference voltage which is serial level as the differential input signal has. Voltage level at the input terminal Vref is at the middle between voltage levels at the input terminals Vinp and Vinn. Voltage level at the input terminal Vref is realized using the resistances that divide.

The first state (Vinp>Vref>Vinn) will be described. Voltage amplitude ΔVin of the differential input signal is set in FIG. 1. Voltage level at the input terminal Vref is the middle between voltage levels at the input terminals Vinp and Vinn. Upper half ΔVin/2 of voltage amplitude ΔVin corresponds to the differential (Vinp−Vref) between voltage levels at the input terminals Vinp and Vref. Lower half ΔVin/2 of voltage amplitude ΔVin corresponds to differential (Vref−Vinn) between voltage levels at the input terminals Vref and Vinn. At this case, voltage level at the positive input port is higher than that at the negative input port. In FIG. 3, drain current ID1 of NMOS transistor 321 increases, drain current ID2 of NMOS transistor 322 decreases. By increase drain current ID1, current value of drain current ID1 becomes larger than that of constant current IM1. So, current II1 (=ID1−IM1) inflows through the negative output port. By decrease drain current ID2, current value of drain current ID2 becomes smaller than that of constant current IM2. So, current IO1 (=ID2−IM2) outflows through the positive output port. Therefore, in FIG. 1, current I1 inflows to the negative output port D of the transconductance amplifier 111, and current I1 outflows from the positive output port C of the transconductance amplifier 111. Similarly, current I2 inflows to the negative output port D of the transconductance amplifier 112, and current I2 outflows from the positive output port C of the transconductance amplifier 112.

In the input resistance portion 110, the transconductance amplifier 111 inflows and outflows current I1, the transconductance amplifier 112 inflows and outflows current I2 and the transconductance amplifier 113 inflows and outflows current I3. Therefore, the input resistance portion 110 inflows and outflows current I4.

The terminal A of the filter portion 120 has input thereto current difference I4 (=2*I1−I3) between current I3 and the sum (2*I1=I1+I2) of current I1 and current I2. Current value of current I4 depends on impedances Z1 and Z2. Impedance Z1 is impedance at an input side in view of nodes N1 and N2. Impedance Z1 is a fixed value, because of only depending on mutual conductance GM of the transconductance amplifier 113. Impedance Z2 is impedance at an output side in view of nodes N1 and N2. Impedance Z2 is a variable value, because of depending on frequency of the differential input signal which is input by the input terminals Vinp and Vinn. When the differential input signal has frequency of which impedances Z1 and Z2 do not match each other, impedance Z3 does not match impedance Z4 and the differential input signal is not input to the output end resistance portion 130. Otherwise, impedance Z3 matches impedance Z4 and the differential input signal is input to the output end resistance portion 130. Impedance Z3 is impedance at an input side in view of nodes N3 and N4. Impedance Z4 is impedance at an output side in view of nodes N3 and N4.

When impedance Z1 matches impedance Z2, current value of current I4 is the same as that of current I3. Current value of current I3 is the same as that of current I1 because of half value of 2*I1. All current value of all current I1–I4 are the same as each other. That means I1=I2=I3=I4. Voltage amplitude in view of nodes N3 and N4 is a half of voltage amplitude ΔVin of the differential input signal in view of nodes N1 and N2. The output terminals Voutp and Voutn is output the differential input signal which has a half of voltage amplitude ΔVin of the differential input signal input by the input terminals Vinp and Vinn. Compared with the first state, the directions flowing current I1–I4 in the second state are reversed but current value are the same.

In the filter circuit according to the first preferred embodiment of the present invention, the transconductance amplifiers 111 and 112 is only input voltage amplitude ΔVin/2 which is a half of voltage amplitude ΔVin of the differential input signal. When the dynamic range Vdr of the transconductance amplifier is set and when the mixed signal having two frequencies in passing band and cutoff band is input as the differential input signal, the filter circuit according to the first preferred embodiment of the present invention outputs a signal having frequency in passing band until peak voltage amplitude becomes twice.

In addition, the transconductance amplifiers used in the input resistance portion are the same those used in the filter portion or the output end resistance portion. The filter circuit according to the first preferred embodiment of the present invention does not need to design newly them. The characteristics of the transconductance amplifiers have good repeatability and high possibility when those are integrated.

In addition, current value of current IM3 is set as constant. However, current value of current IM3 may be set as variable based on the control signal SB. That means that each mutual conductance GM of each of the transconductance amplifiers 111–113 is adjusted. Therefore, when each mutual conductance GM of each of the transconductance amplifiers 111–113 have production tolerances in manufacturing process of the filter circuit, or when the filter circuit is in a change in the ambient temperature during use, the filter circuit according to the first preferred embodiment of the present invention keeps the relationship I1=I2=I3=I4 according to adjust current value of current IM3.

A filter circuit according to a second preferred embodiment of the present invention will be described with reference to FIG. 4. The filter circuit according to the second preferred embodiment of the present invention is R-∞ type filter. The R-∞ type filter is used in a voltage controlled oscillator (VCO) in a phase-locked loop (PLL) circuit.

The composition of the filter circuit according to the second preferred embodiment of the present invention will be described. FIG. 4 is a circuit block diagram showing a filter circuit according to the second preferred embodiment of the present invention.

Figure 4:
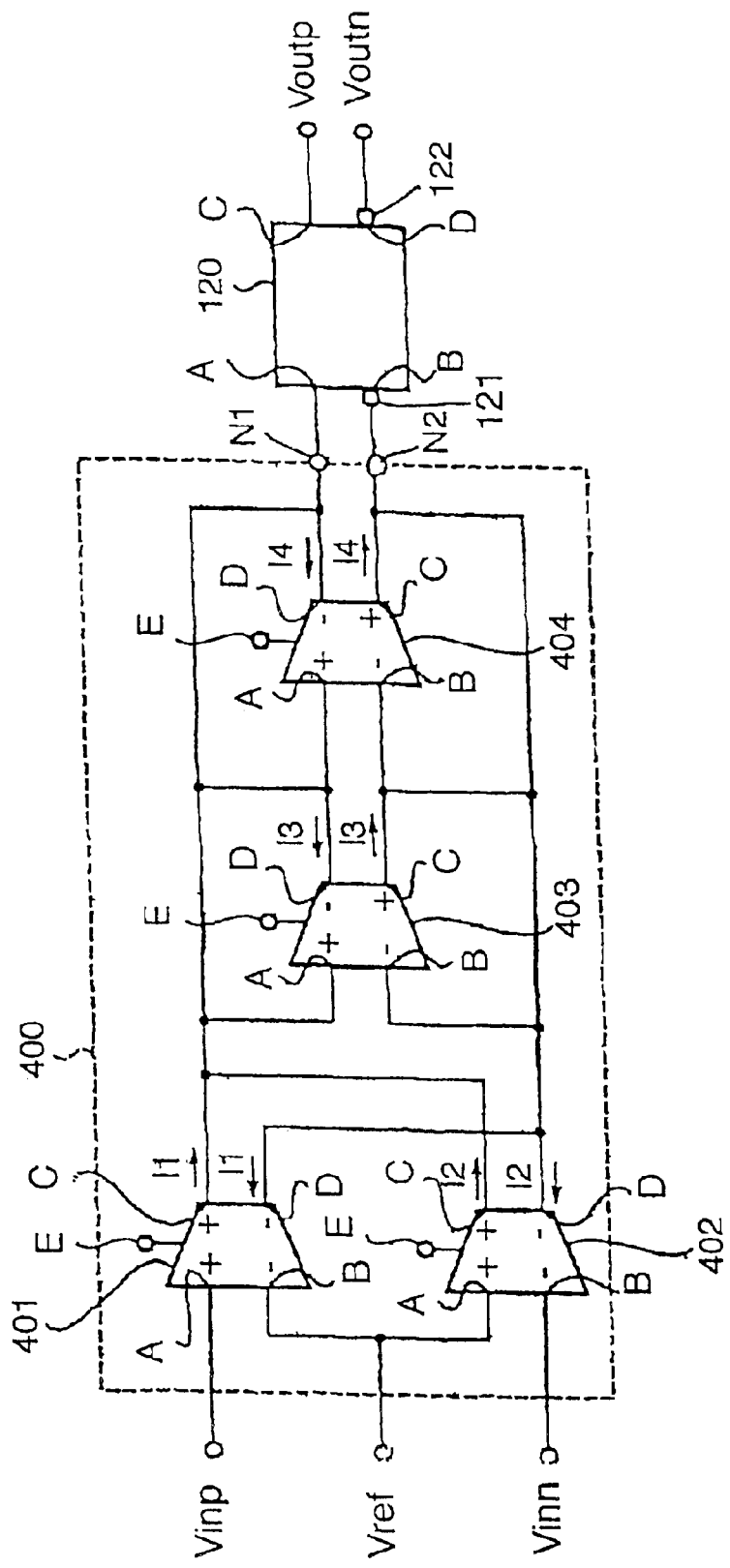
FIG. 4 is a circuit block diagram showing a filter circuit according to a second preferred embodiment of the present invention.

As shown in FIG. 4, the filter circuit has an input resistance portion 400 and the filter portion 120. The input resistance portion 400 is coupled to input terminals Vinp, Vref and Vinn, and is coupled to the filter portion 120 through nodes N1 and N2. The filter portion 120 is coupled to output terminals Voutp and Voutn.

The input resistance portion 400 has four transconductance amplifiers 401–404. In FIG. 4, the input terminal Vinp is coupled to a positive input port A of the transconductance amplifier 401. The input terminal Vref is coupled to a negative input port B of the transconductance amplifier 401 and a positive input port A of the transconductance amplifier 402. The input port Vinn is coupled to a negative input port B of the transconductance amplifier 402. A positive output port C of the transconductance amplifier 401 is coupled to a positive output port C of the transconductance amplifier 402, a positive input port A and a negative output port D of the transconductance amplifier 403 and a positive input port A and a negative output port D of the transconductance amplifier 404. A negative output port D of the transconductance amplifier 401 is coupled to a negative output port D of the transconductance amplifier 402, a negative input port B and a positive output port C of the transconductance amplifier 403 and a negative input port B and a positive output port C of the transconductance amplifier 404. The negative output port D of the transconductance amplifier 404 is coupled to node N1 and the positive output port C thereof is coupled to node N2. A terminal A of the filter port 120 is coupled to node N1, and a terminal B thereof is coupled to node N2 through a reverse terminal 121. A terminal C of the filter port 120 is coupled to the output terminal Voutp, and a terminal D thereof is coupled to the output terminal Voutn through a reverse terminal 122.

As has been mentioned in the first preferred embodiment of the present invention, current I1 at the positive and negative output ports of the transconductance amplifier 401 are input and output, otherwise are not. Voltage level of the positive output port of the transconductance amplifier 401 is the same as that of the negative output port thereof. Current I2 at the positive and negative output ports of the transconductance amplifier 402 are input and output, otherwise are not. Voltage level of the positive output port of the transconductance amplifier 402 is the same as that of the negative output port thereof. Current I3 at the positive and negative output ports of the transconductance amplifier 403 are input and output, otherwise are not. Voltage level of the positive output port of the transconductance amplifier 403 is the same as that of the negative output port thereof. Current I4 at the positive and negative output ports of the transconductance amplifier 404 are input and output, otherwise are not. Voltage level of the positive output port of the transconductance amplifier 404 is the same as that of the negative output port thereof.

When impedance of the input resistance portion 400 matches that of the filter portion 120, all current value of all current I1–I4 are the same as each other. That means I1=I2=I3=I4. The input resistance portion 400 does not supply the filter portion 120 with current, but voltage.

As the filter circuit according to the first preferred embodiment, in the filter circuit according to the second preferred embodiment of the present invention, the transconductance amplifiers 401 and 402 is only input voltage amplitude ΔVin/2 which is a half of voltage amplitude ΔVin of the differential input signal. When the dynamic range Vdr of the transconductance amplifier is set and when the mixed signal having two frequencies in passing band and cutoff band is input as the differential input signal, the filter circuit according to the second preferred embodiment of the present invention outputs a signal having frequency in passing band until peak voltage amplitude becomes twice.

A filter circuit according to a third preferred embodiment of the present invention will be described with reference to FIG. 5. The filter circuit according to the third preferred embodiment of the present invention is 0-R type filter. The 0-R type filter is used in a filter and matching circuit for radio frequency (RF) outputting, a smoothing circuit for a switching power source.

The composition of the filter circuit according to the third preferred embodiment of the present invention will be described. FIG. 5 is a circuit block diagram showing a filter circuit according to the third preferred embodiment of the present invention.

Figure 5:
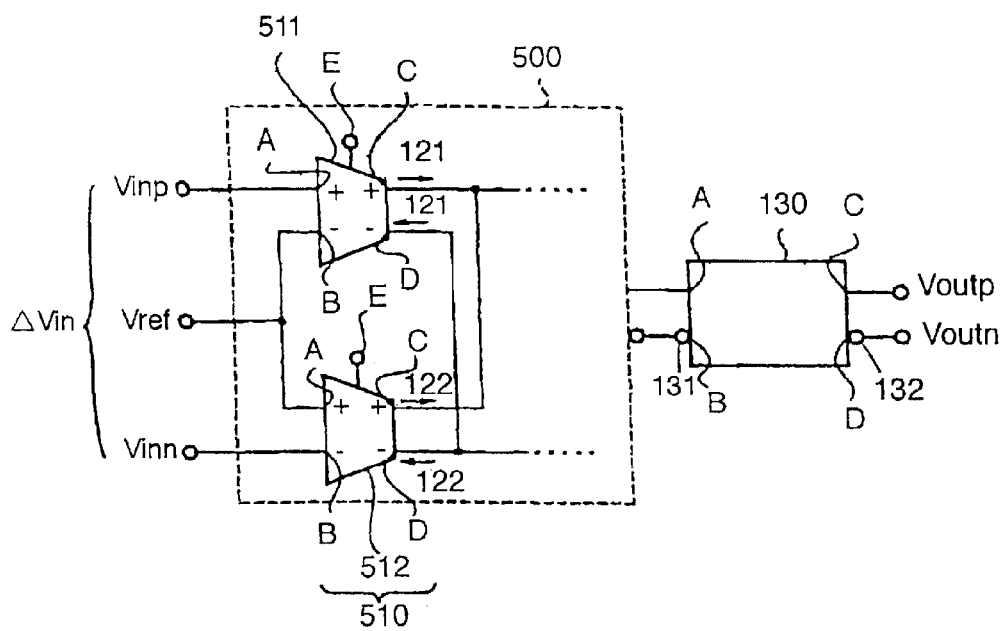
FIG. 5 is a circuit block diagram showing a filter circuit according to a third preferred embodiment of the present invention.
Figure 6A:
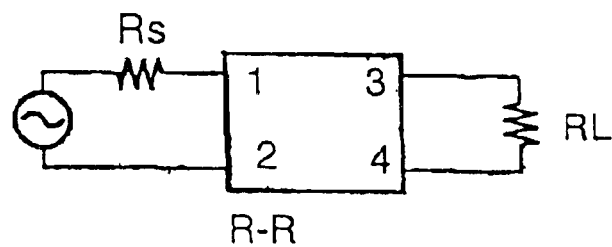
FIGS. 6(A)–6(C) are block diagrams showing LC ladder type filter circuits.
Figure 6B:
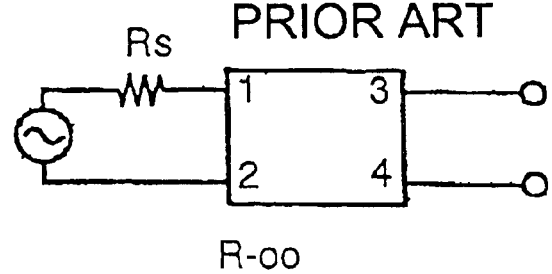
Figure 6C:
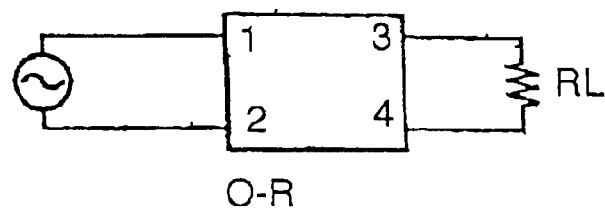
Figure 7:
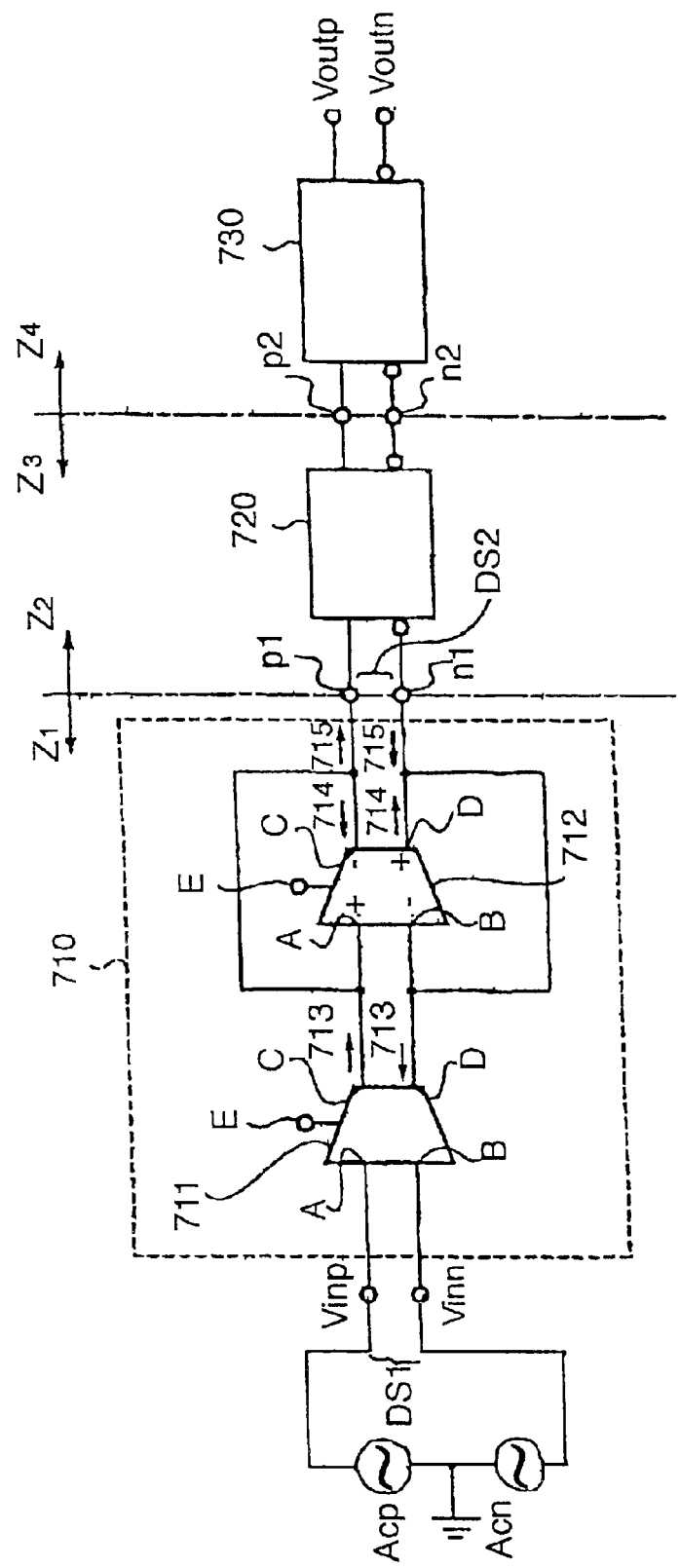
FIG. 7 is a circuit block diagram showing a conventional filter circuit.
Figure 8:
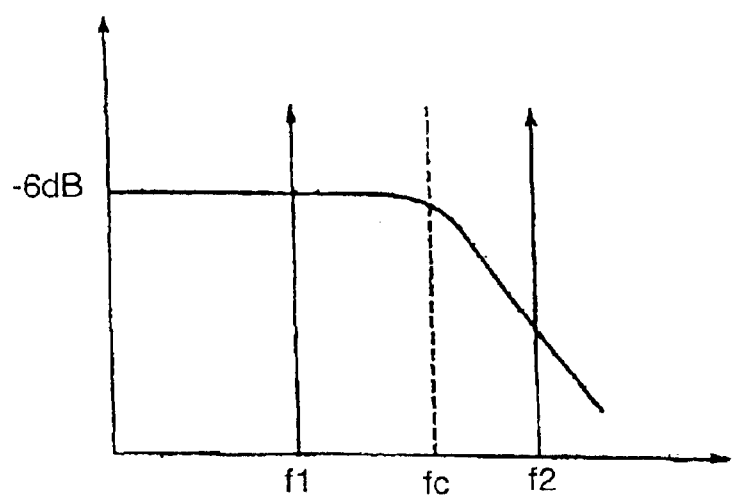
FIG. 8 is wave diagram showing frequency characteristics of the LC ladder type filter circuit.

As shown in FIG. 5, the filter circuit has a filter portion 500 and the output end resistance portion 130. The filter portion 500 is coupled to input terminals Vinp, Vref and Vinn, and is coupled to the output end resistance portion 130. The output end resistance portion 130 is coupled to output terminals Voutp and Voutn.

The filter portion 500 has an input portion 510 and a plurality of transconductance amplifiers. The input portion 510 comprises transconductance amplifiers 511 and 512.

In FIG. 5, the input terminal Vinp is coupled to a positive input port A of the transconductance amplifier 511. The input terminal Vref is coupled to a negative input port B of the transconductance amplifier 511 and a positive input port A of the transconductance amplifier 512. The input port Vinn is coupled to a negative input port B of the transconductance amplifier 512. A positive output port C of the transconductance amplifier 511 is coupled to a positive output port C of the transconductance amplifier 512. A negative output port D of the transconductance amplifier 511 is coupled to a negative output port D of the transconductance amplifier 512.

As the filter circuit according to the first preferred embodiment, in the filter circuit according to the third preferred embodiment of the present invention, the transconductance amplifiers 511 and 512 is only input voltage amplitude ΔVin/2 which is a half of voltage amplitude ΔVin of the differential input signal. When the dynamic range Vdr of the transconductance amplifier is set and when the mixed signal having two frequencies in passing band and cutoff band is input as the differential input signal, the filter circuit according to the third preferred embodiment of the present invention outputs a signal having frequency in passing band until peak voltage amplitude becomes twice.

While the preferred form of the present invention has been described, it is to be understood that modifications will be apparent to those skilled in the art without departing from the spirit of the invention. For example, the filter circuit shown in the present invention is used in an LC-ladder type LPF circuit. However, the filter circuit may be used in a biquad bandpass filter. In addition, the filter circuit may be realized as a circuit on a printed wiring board, so a variable resistor is not needed.

The scope of the invention, therefore, is to be determined solely by the following claims.

What is claimed is:

1. A filter circuit having an input resistance portion, wherein said input resistance portion comprises:
   a first transconductor having a positive input port, a negative input port, a positive output port and a negative output port, wherein said positive input port is impressed with a first voltage, and wherein said negative input port is impressed with a second voltage;
   a second transconductor having a positive input port, a negative input port, a positive output port and a negative output port, wherein said positive input port of the second transconductor is impressed with the second voltage, and wherein said negative input port of the second transconductor is impressed with a third voltage; and a third transconductor having a positive input port, a negative input port, a positive output port and a negative output port, wherein said positive input port of the third transconductor is coupled to the positive output ports of the first and second transconductors and the negative output port of the third transconductor, and wherein said negative input port of the third transconductor is coupled to the negative output ports of the first and second transconductors and the positive output port of the third transconductor.

2. The filter circuit according to claim 1, wherein said first voltage is higher than said third voltage, and wherein said second voltage is a middle voltage between the first and third voltages.

3. The filter circuit according to claim 2, wherein each of the transconductors comprises:
   a first current source having a first terminal impressed with a supply voltage, and a second terminal coupled to the negative output port;
   a second current source having a first terminal impressed with the supply voltage, and a second terminal coupled to the positive output port;
   a first transistor having a control electrode, a first electrode and second electrode, wherein said control electrode is coupled to the positive input port, wherein said first electrode is coupled to the negative output port, and wherein said second electrode is coupled to a first terminal of a third current source; and
   a second transistor having a control electrode, a first electrode and a second electrode, wherein said control electrode of the second transistor is coupled to the negative input port, wherein said first electrode of the second transistor is coupled to the positive output port, and wherein said second electrode of the second transistor is coupled to the first terminal of the third current source,
   wherein the third current source also has a second terminal impressed with ground voltage.

4. The filter circuit according to claim 3, wherein said input resistance portion is coupled to a filter portion through at least one node.

5. The filter circuit according to claim 4, wherein when an impedance of said input resistance portion matches an impedance of the filter portion, a current value at the positive output ports of the first, second and third transconductors are the same.

6. A filter circuit having an input resistance portion, wherein said input resistance portion comprises:
   a first transconductor having a positive input port, a negative input port, a positive output port and a negative output port, wherein said positive input port is impressed with a first voltage, and wherein said negative input port is impressed with a second voltage;
   a second transconductor having a positive input port, a negative input port, a positive output port and a negative output port, wherein said positive input port of the second transconductor is impressed with the second voltage, and wherein said negative input port of the second transconductor is impressed with a third voltage;
   a third transconductor having a positive input port, a negative input port, a positive output port and a negative output port, wherein said positive input port of the third transconductor is coupled to the positive output ports of the first and second transconductors and the negative output port of the third transconductor, and wherein said negative input port of the third transconductor is coupled to the negative output ports of the first and second transconductors and the positive output port of the third transconductor; and
   a fourth transconductor having a positive input port, a negative input port, a positive output port and a negative output port, wherein said positive input port of the fourth transconductor and said negative output port of the fourth transconductor are coupled to the negative output port of the third transconductor, and wherein said negative input port of the fourth transconductor and said positive output port of the fourth transconductor are coupled to the positive output port of the third transconductor.

7. The filter circuit according to claim 6, wherein said first voltage is higher than said third voltage, and wherein said second voltage is a middle voltage between the first and third voltages.

8. The filter circuit according to claim 7, wherein each of the transconductors comprises:
   a first current source having a first terminal impressed with a supply voltage, and a second terminal coupled to the negative output port;
   a second current source having a first terminal impressed with the supply voltage, and a second terminal coupled to the positive output port;
   a first transistor having a control electrode, a first electrode and second electrode, wherein said control electrode is coupled to the positive input port, wherein said first electrode is coupled to the negative output port, and wherein said second electrode is coupled to a first terminal of a third current source; and
   a second transistor having a control electrode, a first electrode and a second electrode, wherein said control electrode of the second transistor is coupled to the negative input port, wherein said first electrode of the second transistor is coupled to the positive output port, and wherein said second electrode of the second transistor is coupled to the first terminal of the third current source,
   wherein the third current source also has a second terminal impressed with ground voltage.

9. The filter circuit according to claim 8, wherein said input resistance portion is coupled to a filter portion through at least one node.

10. The filter circuit according to claim 9, wherein when an impedance of said input resistance portion matches an impedance of the filter portion, a current value at the positive output ports of the first, second, third and fourth transconductors are the same.

11. A filter circuit having a filter portion and an output end resistance portion, wherein said filter portion comprises:
   a first transconductor having a positive input port, a negative input port, a positive output port and a negative output port, wherein said positive input port is impressed with a first voltage, and wherein said negative input port is impressed with a second voltage; and
   a second transconductor having a positive input port, a negative input port, a positive output port and a negative output port, wherein said positive input port of the second transconductor is impressed with the second voltage, wherein said negative input port of the second transconductor is impressed with a third voltage, wherein said positive output port of the second transconductor is coupled to the positive output port of the first transconductor and wherein said negative output port of the second transconductor is coupled to the negative output port of the first transconductor.

12. The filter circuit according to claim 11, wherein said first voltage is higher than said third voltage, and wherein said second voltage is a middle voltage between the first and third voltages.

13. The filter circuit according to claim 12, wherein each of the transconductors comprises:

a first current source having a first terminal impressed with a supply voltage, and a second terminal coupled to the negative output port;

a second current source having a first terminal impressed with the supply voltage, and a second terminal coupled to the positive output port;

a first transistor having a control electrode, a first electrode and a second electrode, wherein said control electrode is coupled to the positive input port, wherein said first electrode is coupled to the negative output port, and wherein said second electrode is coupled to a first terminal of a third current source; and a second transistor having a control electrode, a first electrode and a second electrode, wherein said control electrode of the second transistor is coupled to the negative input port, wherein said first electrode of the second transistor is coupled to the positive output port, and wherein said second electrode of the second transistor is coupled to the first terminal of the third current source, wherein the third current source also has a second terminal impressed with ground voltage.

14. The filter circuit according to claim 13, wherein said filter portion is coupled to the output end resistance portion.

* * * * *